(12) United States Patent
Notzel et al.

(10) Patent No.: US 12,255,231 B2
(45) Date of Patent: Mar. 18, 2025

(54) NANOWIRE ARRAY, OPTOELECTRONIC DEVICE AND PREPARATION METHOD THEREOF

(71) Applicant: South China Normal University, Guangzhou Guangdong (CN)

(72) Inventors: Richard Notzel, Guangzhou Guangdong (CN); Peng Wang, Guangzhou Guangdong (CN); Stefano Sanguinetti, Milan (IT); Guofu Zhou, Guangzhou Guangdong (CN)

(73) Assignee: South China Normal University, Guangdong (CN)

( * ) Notice: Subject to any disclaimer, the term of this patent is extended or adjusted under 35 U.S.C. 154(b) by 207 days.

(21) Appl. No.: 17/254,107

(22) PCT Filed: Jan. 11, 2019

(86) PCT No.: PCT/CN2019/071260
§ 371 (c)(1),
(2) Date: Dec. 18, 2020

(87) PCT Pub. No.: WO2020/140303
PCT Pub. Date: Jul. 9, 2020

(65) Prior Publication Data
US 2021/0336003 A1  Oct. 28, 2021

(30) Foreign Application Priority Data
Dec. 30, 2018 (CN) .......................... 201811648671.3

(51) Int. Cl.
*H01L 29/06*    (2006.01)
*B82Y 40/00*    (2011.01)
(Continued)

(52) U.S. Cl.
CPC .... *H01L 29/0676* (2013.01); *H01L 21/02381* (2013.01); *H01L 21/0254* (2013.01);
(Continued)

(58) Field of Classification Search
CPC ........... H01L 29/0676; H01L 21/02381; H01L 21/0254; H01L 21/02603; H01L 29/2003;
(Continued)

(56) References Cited

U.S. PATENT DOCUMENTS

2015/0076450 A1* 3/2015 Weman ............. H01L 21/02444
257/29
2015/0221821 A1* 8/2015 Svensson ................ H01L 33/24
257/13
(Continued)

FOREIGN PATENT DOCUMENTS

CN    103931004        7/2014
CN    103931004 A      7/2014
(Continued)

OTHER PUBLICATIONS

Cherns et al., ("The growth of In0.5Ga0.5 N and InN layers on (111)Si using nanorod intermediate arrays" Journal of Crystal Growth, vol. 384, Dec. 2013, pp. 55-60, ISSN: 0022-0248, DOI: 10.1016/j.jcrysgro.2013.09.012) (Year: 2013).*
(Continued)

*Primary Examiner* — Fernando L Toledo
*Assistant Examiner* — Jahae Kim
(74) *Attorney, Agent, or Firm* — Vedder Price P.C.; Michael J. Turgeon

(57) ABSTRACT

Provided is a nanowire array, in which a plurality of nanowires are densely packed and in contact with each other via side walls to form a three-dimensional, compact layer structure, wherein the plurality of nanowires are formed from InGaN-based material. Also provided is an optoelectronic
(Continued)

device comprising the nanowire array which is epitaxially grown on a surface of a substrate (12). Further provided are methods for preparing the nanowire array and the optoelectronic device.

14 Claims, 2 Drawing Sheets

(51) Int. Cl.
 *H01L 21/02* (2006.01)
 *H01L 29/20* (2006.01)
(52) U.S. Cl.
 CPC .... *H01L 21/02603* (2013.01); *H01L 29/2003* (2013.01); *B82Y 40/00* (2013.01); *H01L 21/02378* (2013.01); *H01L 21/02389* (2013.01); *H01L 21/02395* (2013.01); *H01L 21/0242* (2013.01)
(58) Field of Classification Search
 CPC ......... H01L 21/02378; H01L 21/02389; H01L 21/02395; H01L 21/0242; H01L 21/02433; H01L 21/02595; H01L 21/02631; H01L 33/18; H01L 33/08; B82Y 40/00; B82Y 10/00; B82Y 20/00; B81B 2207/056; B81C 1/00031
 See application file for complete search history.

(56) References Cited

U.S. PATENT DOCUMENTS

| 2016/0284536 | A1* | 9/2016 | Fukui | H01L 29/068 |
| 2018/0204976 | A1* | 7/2018 | Kim | H01L 31/035227 |

FOREIGN PATENT DOCUMENTS

| CN | 104396028 | A | 3/2015 |
| CN | 105684152 | | 6/2016 |
| CN | 105684152 | A | 6/2016 |
| CN | 107507892 | A | 12/2017 |
| CN | 108193230 | | 6/2018 |
| CN | 108193230 | A | 6/2018 |
| WO | 2013049042 | A2 | 4/2013 |

OTHER PUBLICATIONS

Kumar et al., ("Structural, optical and Carrier dynamics of self-assembled InGaN nanocolumns on Si(111)", Superlattices and Microstructures, vol. 117, May 2018, pp. 25-30, ISSN 0749-6036, DOI: 10.1016/j.spmi.2018.02.036) (Year: 2018).*
Rodriguez et al., ("Electrocatalytic oxidation enhancement at the surface of InGaN films and nanostructures grown directly on Si(111)" Electrochemistry Communications, vol. 60, Nov. 2015, pp. 158-162, ISSN 1388-2481, DOI:10.1016/j.elecom2015.09.003) (Year: 2015).*
"Structural, optical and Carrier dynamics of self-assembled InGaN nanocolumns on Si(111)", Superlattices and Microstructures, vol. 117, May 2018, pp. 25-30, ISSN 0749-6036, DOI: 10.1016/j.spmi.2018.02.036 (Year: 2018).*
"ThegrowthofIn0.5Ga0.5NandInNlayerson(111)Siusingnanorodintermediatearrays" JournalofCrystalGrowth,vol. 384, Dec. 2013,pp. 55-60,ISSN:0022-0248,DOI:10.1016/j.jcrysgro.2013.09.012 (Year: 2013).*
"Structural,opticalandCarrierdynamicsofself-assembledInGaN-nanocolumnsonSi(111)", SuperlatticesandMicrostructures,vol. 117, May 2018,pp. 25-30,ISSN0749-6036,DOI:10.1016/.spmi.2018.02.036 (Year: 2018).*
"ElectrocatalyticoxidationenhancementatthesurfaceofInGaNfilmsandnanostructuresgrowndirectlyonSi(111)" ElectrochemistryCommunications,vol. 60,Nov. 2015,pp. 158-162,ISSN1388-2481,DOI: 10.1016/j.elecom.2015.09.003 (Year: 2015).*
Cherns. D. et al., "The growthofIn0.5Ga0.5N andInNlayerson(111)Siusingnanorod intermediatearrays", Journal of Crystal Growth, vol. 384, Sep. 18, 2013, pp. 55-60.
Paul E.D. et al., "Electrocatalytic oxidation enhancement at the surface of InGaN films and nanostructures grown directly on Si(111)", Electrochemistry Communications, 2015, 60, 158-162.
Praveen Kumar et al., "Structural, Optical and Carrier Dynamics of Self-Assembled InGaN nanocolumns on Si(111)", Superlattices and Microstructures, 2018, 117, 25-30.
Cherns, D. et al. "The Growth of In 0.5Ga 0.5N and InN Layers on (I I I)Si Using Nanorod 1-14 Intermediate Arrays", Journal of Crystal Growth, vol. vol. 384, Sep. 18, 2013 (Sep. 18, 2013) , p. 55 , col. 2, line 20 to p. 59, col. 2, line 10, and figures 2-4.
International Preliminary Report on Patentability, PCT/CN2019/071260, Jul. 15, 2021.
Kumar, Praveen et al. Cherns. D. et al. "Ultrafast Carrier dynamics of InxGa1—xN nanostructures grown directly on Si (111)", Optical Materials 79 (2018) 475-479.
Asev, Pavel et al. "Near-infrared emitting In-rich InGaN layers grown directly on Si: Towards the whole composition range", Applied Physics Letters 106, 072102 (2015).
South Chinese Vandum University, First Office Action, Publication No. 201811648671.3.
South Chinese Vandum University, Second Office Action, Publication No. 201811648671.3.
Zeghouane, Mohammad, "Compositional control of homogenous InGaN nanowires with the in content up to 90%", Nanotechnology, 2018.
Supplementary European Search Report, EP 19 90 6921, Jul. 30, 2021.

* cited by examiner ically stable and inherently laterally electrically conductive.
NANOWIRE ARRAY, OPTOELECTRONIC DEVICE AND PREPARATION METHOD THEREOF The present application is a national phase entry under 35 USC § 371 of International Application PCT/CN2019/071260, filed Jan. 11, 2019, which claims the benefit of and priority to Chinese Patent Application No. 201811648671.3, filed Dec. 30, 2018, the entire disclosures of which are incorporated herein by reference.

TECHNICAL FIELD

The present disclosure relates to the field of semiconductor materials, and more particularly, to a nanowire array, an optoelectronic device comprising the nanowire array and preparation methods thereof.

BACKGROUND

Two classes of epitaxial structures applied most widely for optoelectronic devices, such as light emitting diodes, lasers, solar cells and high power electrical amplifiers are one-dimensional nanowire arrays and three-dimensional, compact, single-crystalline layers. In general, the intrinsic properties required by the epitaxial materials for optoelectronic device applications comprise low defect density, large active volume, flexible heterostructure formation, easy device processing, and in-plane lateral structure stability.

InGaN is an ideal material for the electrochemical devices. InGaN exhibits a band gap which is tunable from the ultraviolet band for GaN (3.4 eV/365 nm) to the near-infrared band for InN (0.7 eV/1.7 μm) with increasing In content. InGaN has a very high absorption coefficient, which is ten times that of GaAs. Moreover, InGaN has many advantages such as a high carrier mobility, radiation hardness, stable chemical property, biocompatibility, and non-toxicity.

With InGaN-based materials, one-dimensional nanowires are formed at a high active-N-to-metal flux ratio without any catalyst or self-catalyst (Ga/In droplets), while compact, single-crystalline layers are formed at a close-to-stoichiometric active-N-to-metal flux ratio.

Epitaxial, one-dimensional nanowires satisfy the requirement of low defect density due to the annihilation of dislocations at the vertical nanowire sidewalls (i.e., dislocations rarely occur at the vertical nanowire sidewalls), which significantly reduces the defect density. This leads to highly scattered carriers and consequently affecting carrier mobility, as lattice distortions caused by the dislocations are centers for carrier scattering. Since a high dislocation density can lead to increased non-radiative recombination centers and limit the improvement of quantum efficiency, the annihilation and reduced density of dislocations are beneficial for improving radiative recombination efficiency and carrier mobility. Unlike the layer structures, the growth of high-quality nanowires is largely independent of the choice of the substrate as any dislocations generated at the substrate-nanowire interface are expelled at the nanowire sidewalls during growth. During the growth of the nanowires, the flexible heterostructure formation in the heteroepitaxy growth from a lattice-mismatched substrate is facilitated by lateral elastic strain relaxation without dislocation formation. This is due to the small nanowire diameter of typically from 50 to 100 nm. The formation of the nanowires is usually regulated by controlling the active-N-to-metal flux ratio. In order to limit the total N flux and the pressure in a growth chamber, a high active-N-to-metal flux ratio is commonly set by using a low metal flux to control nanowire growth. However, the low metal flux may increase metal adatom migration length and promote nanowire separation, resulting in independent and separated nanowire arrays.

In the prior art, the nanowires, which are composed of pure GaN nanowires or GaN nanowires with inclusions of InGaN, are usually grown at an elevated growth temperature. The elevated growth temperature can additionally increase the metal adatom migration length and accelerate nanowire separation. Therefore, in the existing nanowire arrays, the nanowires are free-standing with lateral separations of the order of their diameter or larger, such that no lateral electrical conduction can be formed between the nanowires. This results in a small active volume which can be covered by a unit surface area of formed InGaN material.

In the prior art, the nanowires are mechanically fragile and breakable, and are electrically isolated from each other. Moreover, such highly non-planar structures are difficult to be processed into actual devices, because some processes, such as lithographic steps and metal deposition, involved in the preparing processes of these devices are unmatched with the non-planar structures.

In contrast, epitaxial three-dimensional, compact, single-crystalline layer structures exhibit a larger effective active volume per geometric surface area. Such structures are easy to be processed into various devices, which are mechanically stable and inherently laterally electrically conductive. However, the three-dimensional, compact, single-crystalline layer structures may lead to dislocations which are formed during growth at the substrate-layer interface and propagate through the whole layer structure to the surface via the active area, thereby reducing the quality of the materials.

It should be further emphasized that, for compact layer structures, the established mature techniques such as surface texturing and deposition, may be used to achieve free-standing nanowires and realize enhanced light extraction and absorption of light scattering.

In order to overcome the defects of the existing one-dimensional separate nanowires and three-dimensional, compact, single-crystalline layers, there is an urgent need to develop a new high-performance InGaN-based material and preparation methods thereof.

SUMMARY

The present disclosure aims to provide a nanowire array, in which nanowires are densely packed (i.e., the nanowires are in contact with each other via sidewalls thereof), and to provide a device having the nanowire array, as well as the preparation methods thereof.

One of the objectives of the present disclosure is to provide a nanowire array, in which a plurality of nanowires are densely packed and are in contact with each other via sidewalls thereof, so as to form a three-dimensional compact layer structure.

Another objective of the present disclosure is to provide an optoelectronic device having the above nanowire array.

Another objective of the present disclosure is to provide methods for preparing the nanowire array and the optoelectronic device.

In one aspect of the present disclosure, a nanowire array is provided, in which a plurality of nanowires are densely packed and are in contact with each other via sidewalls thereof, so as to form a three-dimensional compact layer structure, wherein the nanowires are formed from InGaN-based material.

Further, each of the plurality of nanowire in the nanowire array may have a diameter of 100 nm or less, more preferably have a diameter of 20 to 40 nm. For example, each of the plurality of nanowires may have a diameter of 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm or 100 nm.

Further, the length of the plurality of nanowires in the nanowire array corresponds to the thickness of the three-dimensional compact layer structure. Preferably, the length of the plurality of nanowires may be 100 nm to 2 µm, such as 100 nm, 200 nm, 300 nm, 400 nm, 500 nm, 600 nm, 700 nm, 800 nm, 900 nm, 1 µm, 1.5 µm and 2 µm. However, it should be understood that the nanowire length of the present disclosure is not limited to the length listed above, and can be adjusted depending on the targeted application. Preferably, the nanowire length may depend on the structure of the targeted device with established layer design, e.g., heterostructure design for light emitting diodes, lasers, solar cells and high-power electronic amplifiers, among others.

The plurality of nanowires in the nanowire array of the present disclosure are high-density, elongated and densely packed (FIGS. 1 and 2). Specifically, the plurality of nanowires in the nanowire array can realize lateral electrical conduction through the sidewall contact. This means that the plurality of nanowires in the nanowire array of the present disclosure are in contact with each other through the sidewalls thereof, and are combined and grown together. Therefore, an interconnecting path is set up in the self-assembled and grown one-dimensional nanowires for lateral electrical conduction.

Preferably, the In content of the nanowires may be controlled by changing the In-to-Ga flux ratio during the growth and may be any value between 0 and 1. That is, the In content of the nanowires may vary from pure binary compound GaN to pure binary compound InN. However, it should be understood that the In content of the nanowires depends on the targeted device for which the nanowires are to be applied.

In another aspect of the present disclosure, an optoelectronic device having the nanowire array of the present disclosure is provided, in which the nanowire array is epitaxially grown on a substrate surface. Preferably, the substrate may be a sapphire, gallium nitride, silicon, silicon carbide or gallium arsenide substrate, and more preferably a silicon substrate. For example, a silicon wafer or a silicon-based layer structure may be used as the substrate of the InGaN-based optoelectronic device of the present disclosure. The InGaN-based optoelectronic device may be grown on a Si (111) or (100) surface of the silicon wafer or silicon layer structure. Preferably, the substrate has been or been not performed with surface nitridation. The surface nitridation of the substrate can be processed as described in P. Aseev et al., Applied Physics Letters 106,072102 (2015)), prior to the growth of the InGaN-based optoelectronic device.

In another aspect of the present disclosure, a method for preparing the nanowire array of the present disclosure is provided.

In another aspect of the present disclosure, a method for preparing the optoelectronic device of the present disclosure is provided. The method comprises the following steps of: a) providing a substrate; and b) epitaxially growing a three-dimensional, compact, layer structure composed of a nanowire array on the substrate, wherein the nanowire array comprise a plurality of nanowires which are densely packed and in contact with each other through the sidewalls to form the three-dimensional, compact, layer structure.

Preferably, the above method of the present disclosure may comprise a step of adjusting the In-to-Ga flux ratio to be a value in a range from zero to infinite.

Further, for low In-to-Ga flux ratio of 0.4 or less (corresponding to an In content of the InGaN-based material below 30%), the growth temperature is adjusted between 500 and 900° C., most preferably between 550° C. and 750° C. Such high growth temperature is commonly used and needed for low-In-content InGaN materials, promoting high crystal quality. Further, the active N flux may be adjusted to two or more times the total metal flux, most preferably to 5-6 times the total metal flux. This very high active N flux is required due to the relatively high growth temperature.

It is known that high growth temperature can reduce the sticking efficiency of active N atoms on a growth surface and increase the diffusion length of metal adatoms, thereby reducing a nucleation density of the nanowires and promoting the separation of the nanowires. In order to avoid these phenomena, in the present disclosure, a very high active N flux is used to obtain the InGaN-based optoelectronic device of the present disclosure. The very high active N flux may be obtained by a new generation of radio frequency active N plasma sources combined with inductive and capacitive coupling.

Further, for high In-to-Ga flux ratio of above 0.4 (corresponding to an In content of or above 30% of the InGaN-based material), the growth temperature is adjusted between 300 and 500° C., most preferably between 420 and 480° C. This growth temperature is required to avoid phase separation, InN decomposition and In desorption during the growth of high-In-content InGaN. Still, high material quality can be obtained due to the larger adatom migration length of In than that of Ga. Further, the active N flux may be 2 or more times the total metal flux, most preferably 3 to 4 times the total metal flux. The active N flux may be achieved by using conventional active N plasma sources. A lower active N flux (compared to the case of a low In-to-Ga flux ratio or In content) is practical due to the higher sticking efficiency of active N atoms on the growing surface for lower growth temperature, as well as due to the decreasing metal adatom diffusion length, which can increase the nucleation density of the growing nanowires (i.e., reducing nanowire separation) and thus obtain the InGaN-based optoelectronic device of the present disclosure.

Further, the nanowire array of the present disclosure is epitaxially grown along a crystallographic c-axis of a wurtzite structure. The growth of the nanowire array can be supported by the substrate.

Further, the Ga and In fluxes may be provided by evaporating highly pure Ga and In metal sources, or by supplying corresponding metalorganic precursors for Ga and In. The metalorganic precursors for Ga may comprise, for example, triethylgallium (TEGa), trimethylgallium (TMGa), and the like. The metalorganic precursors for In may comprise, for example, triethyl indium (TEIn), trimethyl indium (TMIn), and the like.

In addition, the In-to-Ga flux ratio may be controlled by the evaporation temperatures for pure In and Ga metals, or by mass flow controllers for the metalorganic precursors of In and Ga, so as to grow an InGaN-based epitaxial structure with a specific In content from a pure GaN compound to a pure InN compound.

Further, the active N flux may be provided by a radio-frequency active N plasma source or by introducing ammonia into the epitaxial growth chamber.

It should be understood that, in the present disclosure, the active N flux and the total In plus Ga metal flux may be referred to and controlled independently, instead of referring to the active N-to-metal flux ratio.

Further, the total metal flux is controlled to a value corresponding to the epitaxial growth rate of 0.2 to 1 μm/h, most preferably to the epitaxial growth rate of 0.5 to 0.6 μm/h. This metal flux can produce a high density of nucleation islands for the growth of densely packed nanowires.

According to an embodiment of the present disclosure, the InGaN-based optoelectronic device may comprise a buffer layer, such as a GaN or AlN buffer layer, between the InGaN layer and the substrate. According to another embodiment of the present disclosure, the InGaN-based optoelectronic device may have no buffer layer between the InGaN layer and the substrate.

According to an embodiment of the present disclosure, the InGaN-based optoelectronic device may be grown by means of Molecular Beam Epitaxy (MBE) or Metal-Organic Chemical Vapor Deposition (MOCVD).

In the prior art, especially for the growth on the Si substrate, most of researches are limited to pure GaN nanowires or GaN nanowires with insertions of InGaN layers, which are grown at elevated temperature (e.g., the growth temperature of InGaN with a low In content) and with low metal flux to obtain a high active N-to-metal flux ratio. This would result in completely separated nanowires. Direct growth of InGaN nanowires without GaN or AlN buffer layers has not achieved on the Si substrate. This is because that such buffer layers are needed to allow wetting and support epitaxial growth of InGaN with high crystal quality. Therefore, it is unable to be realized and not anticipated in the prior art to manufacture In-rich, densely packed InGaN nanowires without GaN or AlN buffer layer, by epitaxially growing at a low temperature (and employing a possible appropriate active N flux) to obtain the InGaN-based material of the present disclosure.

As mentioned above, the nanowires of the prior art are mechanically fragile and breakable, and have no direct electrical contact with each other. In contrast, the InGaN-based optoelectronic device of the present disclosure comprises a three-dimensional, compact structure composed of the one-dimensional InGaN nanowires, in which the one-dimensional InGaN nanowires are in contact with each other through the sidewalls and realize lateral electrical conduction. The inventor found that the nanowire array comprising densely packed InGaN nanowires, can be obtained by maintaining a sufficiently high metal flux, and thus the InGaN-based optoelectronic device composed of the nanowire array can be further obtained.

The InGaN-based optoelectronic devices of the present disclosure comprises In in an amount of zero to one, and has InGaN-based three-dimensional, compact structures applied to the optoelectronic devices, combining the advantages of one-dimensional nanowires and three-dimensional, compact, layer structure, while eliminating the drawbacks both of them. Specifically, the InGaN-based optoelectronic devices of the present disclosure have low defect density, large active volume, flexible heterostructure, easy device processing, structure stability, and preferably has in-plane lateral electrical conductivity.

BRIEF DESCRIPTION OF THE DRAWINGS

Hereinafter, the present disclosure is further described with reference to the drawings and specific embodiments. The exemplary embodiments of the present disclosure are illustrated in the accompanying drawings, wherein similar reference numerals indicate the same or similar elements. In the drawings:

FIG. 1A schematically shows a top view of an InGaN-based optoelectronic device, in which the InGaN-based optoelectronic device is composed of InGaN nanowires with a diameter (11). For clarity of representation, the sizes of different parts are not shown to in scale. FIG. 1B shows a Scanning Electron Microscope (SEM) top view of an InGaN three-dimensional, compact structure.

FIG. 2A schematically shows a cross-sectional view of an InGaN-based three-dimensional, compact structure grown on a substrate (12). It should be understood that the sizes of different parts are not shown in scale. FIG. 2B shows an SEM cross-sectional view of an InGaN three-dimensional, compact structure epitaxially grown on a Si (111) substrate with surface nitridation.

DETAILED DESCRIPTION

The present disclosure is described in detail hereinafter through the specific embodiments. However, it should be understood that the present disclosure is not limited to the following specific embodiments. The scope of protection of the present disclosure is defined by the appending claims. Within the scope of protection of the present disclosure, the following embodiments can be arbitrarily changed and combined. The directional terms mentioned in the embodiments, such as "up", "down", "front", "back", "left", "right", and the like, are only referred to the directions of the drawings, and are not used to limit the scope of protection of the present disclosure.

EXAMPLES

In this example, a three-dimensional dense layered structure composed of one-dimensional InGaN nanowires was prepared by the following steps:
1) providing a Si (111) substrate with surface nitridation,
2) epitaxially growing one-dimensional InGaN nanowires by means of a plasma-assisted molecular beam epitaxy device (Vecco Gen II) on the Si (111) substrate, wherein the specific settings are as follows:
   the In/Ga total metal flux was adjusted to obtain a growth rate of about 0.5 μm/h;
   the In/Ga flux ratio was adjusted to be 5 and the growth temperature was set to be 450° C., the active N flux was adjusted to be 3 times the In/Ga metal flux.

Figure 1:
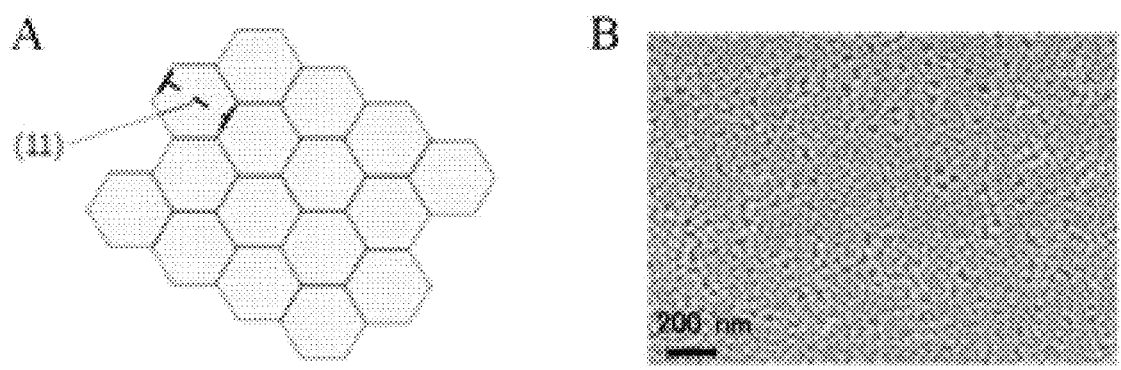
FIG. 1 shows a top view of an InGaN-based optoelectronic device according to an embodiment of the present disclosure.
Figure 2:
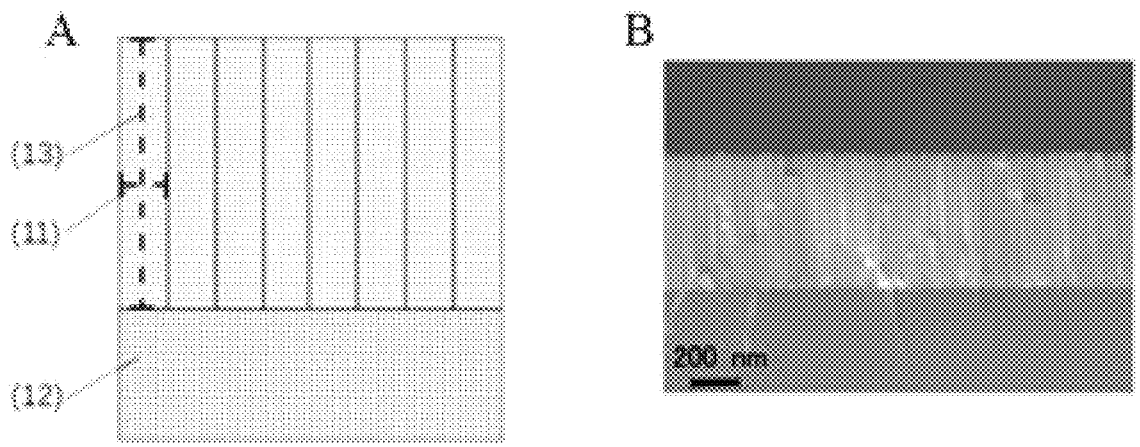
FIG. 2 shows a cross-sectional view of an InGaN-based optoelectronic device according to an embodiment of the present disclosure.

An InGaN three-dimensional, compact structure was obtained by the above method, as shown in FIGS. 1 and 2. It can be seen that the InGaN three-dimensional, compact structure is composed of densely packed one-dimensional nanowires with 71% In content, and has a thickness of about 600 nm.

FIG. 1A schematically shows a top view of an exemplary InGaN three-dimensional, compact structure, and shows a part of densely packed one-dimensional nanowires with a diameter 11.

FIG. 1B shows a scanning electron microscope top view of the above InGaN three-dimensional compact structure material.

For measuring the lateral electrical conductivity of the InGaN three-dimensional, compact structure, two metal ohmic Al contacts, 1 mm apart, are deposited on the surface of the structure in a metal evaporation equipment. Standard current-voltage measurements are performed with a Keithley source meter. Results show that the lateral electrical conductivity of the InGaN three-dimensional is 50 $\Omega^{-1}$ cm$^{-1}$. This is comparable, within the same order of magnitude, with the electrical conductivity of compact, single-crystalline InGaN epitaxial layer structures.

FIG. 2A schematically shows a cross-sectional view of an InGaN-based three-dimensional, compact structure. In particular, FIG. 2A shows a substrate 12, an InGaN three-dimensional, compact structure of a thickness 13, and one-dimensional InGaN nanowires of a diameter 11.

FIG. 2B shows an SEM cross-sectional view of an InGaN three-dimensional, compact structure with an In content of 71% epitaxially grown on the Si (111) substrate with surface nitridation. As can be seen, the InGaN three-dimensional, compact structure has nanowires with a thickness of 600 nm.

Figure 3:
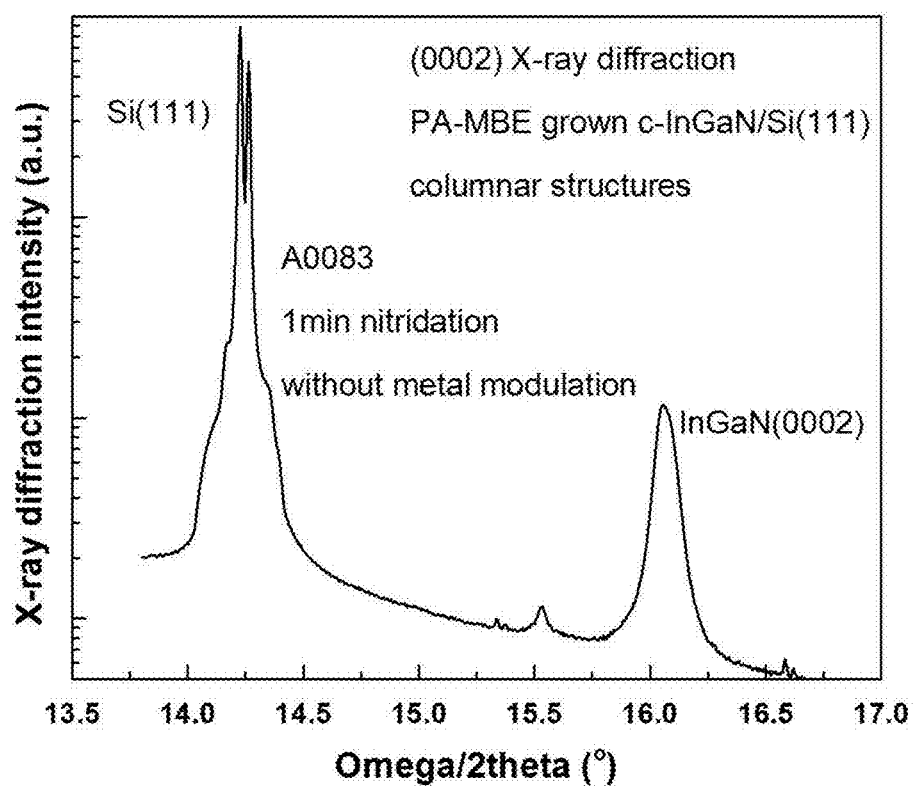
FIG. 3 shows X-ray diffraction spectra of an InGaN-based optoelectronic device according to an embodiment of the present disclosure. CuKα radiation is used to perform omega/2θ scans in the vicinity of the symmetric Si (111) and InGaN (0002) crystal plane reflection.

In addition, the InGaN three-dimensional, compact structure prepared in this example is tested by X-ray diffraction, and results are shown in FIG. 3. FIG. 3 shows omega/2θ diffraction peaks, with logarithmic scale, of symmetric Si (111) and InGaN (0002), by using Cu Kα1 and Cu Kα2 X-ray radiation sources. The diffraction peak of Si (111) crystallographic planes is centered at 14.2°, and the diffraction peak of an InGaN (0002) crystallographic planes with 71% In content is centered at 16.07°. The X-ray diffraction measurement results show that the Si-based InGaN three-dimensional, compact structure prepared in this example has significant and symmetric crystallographic plane diffraction peaks. The results show that the Si-based InGaN three-dimensional, compact structure prepared in this example has good crystal quality.

The preferred embodiments of the present disclosure are specifically illustrated by the contents above, but the present disclosure is not limited to the embodiments. Those skilled in the art can make various equivalent modifications or replacements without departing from the scope of the present disclosure. These equivalent modifications or replacements shall all fall within the scope defined by the claims of the present disclosure.

What is claimed is:

1. A method for preparing the nanowire array, comprising adjusting an In-to-Ga flux ratio in a range from zero to infinite,
    when the In-to-Ga flux ratio is 0.4 or less, producing an InGaN layer having an In content of 30% or less, at a growth temperature ranging from 500 to 900° C.;
wherein, an active N flux is 5 to 6 times a total metal flux consisting of In and Ga;
    when the In-to-Ga flux ratio is above 0.4, producing the InGaN layer having the In content above 30%, at the growth temperature ranging from 300 to 500° C.; wherein, the active N flux is 3 to 4 times the total metal flux consisting of In and Ga;
    wherein the total metal flux consisting of In and Ga to a value corresponding to a growth rate ranging from 0.2 to 1 μm/h;
    wherein the nanowire array comprises a plurality of nanowires which are densely packed and in contact with each other via sidewalls thereof, such that a three-dimensional, compact layer structure is formed;
    wherein the plurality of nanowires are formed from InGaN-based material; and
    wherein each of the plurality of nanowires in the nanowire array has a diameter of 25 nm to 100 nm.

2. The method for preparing the nanowire array according to claim 1, wherein each of the plurality of nanowires in the nanowire array has a length corresponding to a thickness of the three-dimensional, compact layer structure, and has the length of 100 nm to 2 μm.

3. The method for preparing the nanowire array according to claim 1, wherein the plurality of nanowires in the nanowire array are in contact with each other via sidewalls thereof, so as to form lateral electrical conduction.

4. An optoelectronic device comprising the nanowire array prepared by the method for preparing the nanowire array according to claim 1, epitaxially grown on a surface of a substrate.

5. The optoelectronic device according to claim 4, wherein the nanowire array is grown on a Si (111) or Si (100) surface of the silicon wafer or silicon-based layer structure.

6. A method for preparing the optoelectronic device according to claim 4, comprising the following steps of:
    1) Providing the substrate; and
    2) epitaxially growing a three-dimensional, compact layer structure composed of the nanowire array on the substrate, wherein the nanowire array comprises the plurality of nanowires which are densely packed and in contact with each other via sidewalls to form the three-dimensional, compact layer structure.

7. The method according to claim 6, wherein the plurality of the nanowires is epitaxially grown along a crystallographic c-axis of a wurtzite structure.

8. The method according to claim 6, wherein the substrate is selected from a sapphire, gallium nitride, silicon, silicon carbide or gallium arsenide substrate.

9. The method for preparing the nanowire array according to claim 1, wherein, when the In-to-Ga flux ratio is 0.4 or less, the InGaN layer is produced at the growth temperature ranging from 550 to 750° C.

10. The method for preparing the nanowire array according to claim 1, wherein, when the In-to-Ga flux ratio is above 0.4, the InGaN layer is produced at the growth temperature ranging from 420 to 480° C.

11. The method according to claim 1 comprising adjusting the total metal flux consisting of In and Ga to the value corresponding to the growth rate ranging from 0.5 to 0.6 μm/h.

12. The optoelectronic device according to claim 4, wherein the substrate is selected from a sapphire, gallium nitride, silicon, silicon carbide or gallium arsenide substrate.

13. The optoelectronic device according to claim 4, wherein the substrate is a silicon substrate.

14. The optoelectronic device according to claim 4, wherein the substrate is a silicon wafer or silicon-based layer structure.

* * * * *